United States Patent
Archer et al.

(10) Patent No.: US 11,764,740 B2
(45) Date of Patent: Sep. 19, 2023

(54) CONTROL OF BASE CURRENTS FOR OUTPUT DRIVER TRANSISTORS IN AMPLIFIERS

(71) Applicant: TEXAS INSTRUMENTS INCORPORATED, Dallas, TX (US)

(72) Inventors: Tyler James Archer, Tucson, AZ (US); Joel Martin Halbert, Tucson, AZ (US); Bharath Karthik Vasan, Tucson, AZ (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/462,930

(22) Filed: Aug. 31, 2021

(65) Prior Publication Data

US 2023/0069204 A1     Mar. 2, 2023

(51) Int. Cl.
*H03F 3/04*     (2006.01)
*H03F 3/26*     (2006.01)

(52) U.S. Cl.
CPC ..................................... *H03F 3/04* (2013.01)

(58) Field of Classification Search
CPC ................. H03F 3/04; H03F 3/18; H03F 3/26; H03F 3/45

USPC ................ 330/264, 296, 310, 267
See application file for complete search history.

(56) References Cited

U.S. PATENT DOCUMENTS 7,411,455 B2\*    8/2008    Smith .................. H03F 3/3076
                                                                        330/264

\* cited by examiner

*Primary Examiner* — Hieu P Nguyen
(74) *Attorney, Agent, or Firm* — John R. Pessetto; Frank D. Cimino

(57) ABSTRACT

Examples of amplifiers accurately generate control currents for control terminals of output drivers using current-replication transistors and current mirrors. An input terminal of a first current mirror is coupled to the control terminal of a first current-replication transistor, and an input terminal of a second current mirror is coupled to the control terminal of a second current-replication transistor. The output terminals of the first and second current mirrors are coupled to the control terminals of first and second output drivers, respectively. First and second intermediate currents indicative of first and second currents flowing to the first and second output driver elements, respectively, are generated. Using the first and second current mirrors, first and second control currents are generated to control the first and second output driver elements, respectively, by scaling the first and second intermediate currents according to the gain factors of the current mirrors.

14 Claims, 5 Drawing Sheets

US 11,764,740 B2

CONTROL OF BASE CURRENTS FOR OUTPUT DRIVER TRANSISTORS IN AMPLIFIERS

CROSS-REFERENCE TO RELATED APPLICATION(S)

This application is related to the application entitled "CONTROL OF INPUT BIAS CURRENT MODULATION IN AMPLIFIERS", assigned to the assignee of the present application and filed concurrently herewith. The content of this related application is incorporated by reference herein.

FIELD OF DISCLOSURE

This disclosure relates generally to control of base currents for bipolar junction transistors (BJTs) used as output drivers in amplifiers, and more particularly to techniques for adaptively generating base currents in BJT amplifiers based on demand and independent of transistor gain variation.

BACKGROUND

BJT amplifier output drivers have base currents that vary with output current. At times, these base currents become large, which in turn may require large quiescent bias currents from which to draw in the output stages. This results in undesirable high quiescent power consumption. To avoid this, variable bias currents to supply the bases of the output driver transistors may be generated according to demand. It is desirable that the generated bias currents accurately match the base current demand to avoid residual error currents that would affect the voltage bias circuit, which forms the input stage of the BJT amplifier. That is, for each output transistor, the corresponding variable bias current flowing to or away from the current path coupled to the base of that transistor is optimally set to equal the variable demand-current fluctuation flowing to or away from the base of that transistor, so there is no residual error current flowing with or opposite the base current.

Various driver-stage techniques that dynamically supply the needed base current have been implemented. However, each of these known techniques suffers from one or more of the following disadvantages: bandwidth and phase response limitations, voltage headroom degradation, and process and temperature sensitivity.

One previous approach uses fixed attenuation current mirrors to approximate the output driver base currents from the collector currents of the output driver transistors. Each attenuation current mirror senses the collector current of the corresponding output transistor to approximate its base current. Current mirror attenuations are set based on typical expected values of output driver transistor current gains. However, unavoidable variation in the current gains of the output driver transistors, which result from variations in the output current, temperature, process, and mechanical strain, create base current demands that vary significantly from the fixed attenuation outputs of the collector-current mirrors. The resulting residual error currents cause modulation of the current input to the voltage bias circuit and the voltage across the output of the voltage bias circuit, causing downstream signal distortion. Variation of error current DC components also causes the quiescent bias voltage at the output of the voltage bias circuit to vary, which in turn affects the quiescent biasing of the output driver transistors.

Improvements in this area, particularly in reducing the magnitudes of the residual error currents, are thus desirable.

SUMMARY

In accordance with an example, an amplifier comprises first and second output drivers having respective control terminals; first and second current-replication transistors having respective control terminals; and first and second current mirrors. The first current mirror has an input current terminal coupled to the control terminal of the first current-replication transistor and has an output current terminal coupled to the control terminal of the first output driver. The second current mirror has an input current terminal coupled to the control terminal of the second current-replication transistor and has an output current terminal coupled to the control terminal of the second output driver.

In accordance with an example, an amplifier comprises an output driver stage including first and second control terminal nodes and an output terminal at which an output signal of the amplifier is generated; a tracking stage coupled to the output driver stage and configured to track current demands of the output driver stage over variations of gains of currents supplied to the control terminals of the output driver stage; and a current generating stage coupled to the tracking stage and configured to generate currents for the control terminals of the output stage.

In accordance with an example, a method comprises generating, using first and second current-replication elements, first and second intermediate currents that are indicative of first and second currents flowing to first and second output driver elements, respectively, of an amplifier; and generating, using first and second current mirrors, first and second control currents to control the first and second output driver elements, respectively, by scaling the first and second intermediate currents according to a gain factor.

These and other features will be better understood from the following detailed description with reference to the accompanying drawings.

BRIEF DESCRIPTION OF THE DRAWINGS

Features of the disclosure may be understood from the following figures taken in conjunction with the detailed description.

DETAILED DESCRIPTION

Figure 1:
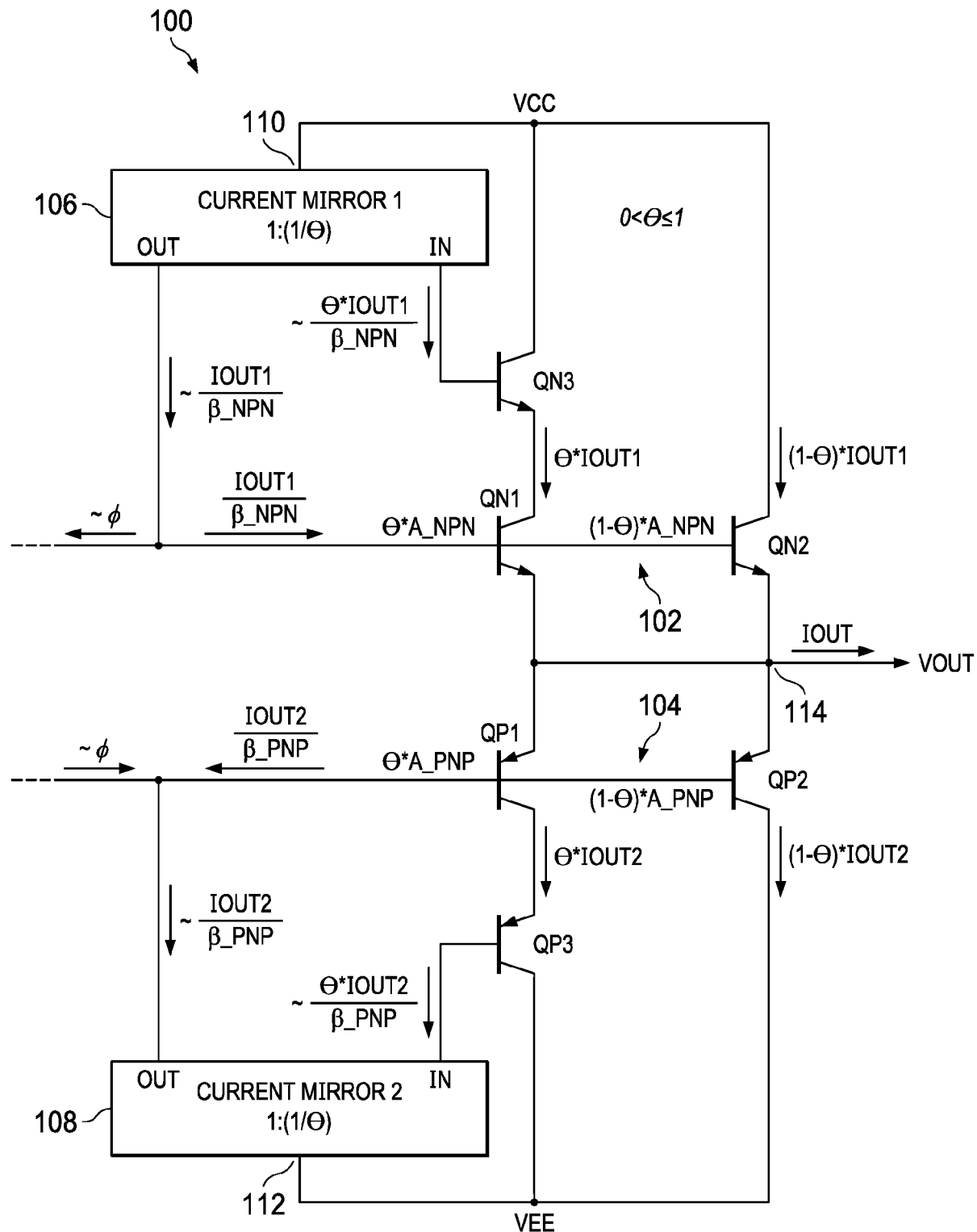
FIG. 1 is a circuit diagram of a first example of an amplifier with BJT output transistors.

Specific examples are described below in detail with reference to the accompanying figures. These examples are not intended to be limiting. In the drawings, corresponding numerals and symbols generally refer to corresponding parts unless otherwise indicated. The objects depicted in the drawings are not necessarily drawn to scale.

In example arrangements, circuits and methods are provided that avoid or minimize the occurrence of residual error currents, thus eliminating or minimizing a cause of output signal distortion and undesirable variation in the quiescent biasing of output driver transistors. In an example, a tracking stage in a BJT amplifier closely tracks or monitors the current demand of an output driver stage in such amplifier over variations in current gain (β), rather than depending on fixed current mirror attenuations that are largely unresponsive to β variation. In an example, the tracking stage is implemented by current-replication transistors, and the output driver stage is implemented by output driver transistors. In an example, the current-replication transistors more accurately track and replicate the actual base currents of the output driver transistors over β variation by sensing portions of the output transistors' collector currents and presenting their correspondingly β-responsive base currents to the variable base-current generation circuitry. In an example, a current generating stage, e.g., current mirrors, rescale and supply β-responsive replica currents back to the bases of the output driver transistors.

FIG. 1 is a circuit diagram of a first example of a BJT amplifier 100 ("amplifier 100"). Amplifier 100 includes first and second output drivers 102 and 104, respectively. In the illustrated example, first output driver 102 includes first and second output driver transistors QN1 and QN2, each of which may be an n-type BJT, i.e. NPN transistor. In the illustrated example, second output driver 104 includes third and fourth output transistors QP1 and QP2, each of which may be a p-type BJT, i.e. PNP transistor. QN1 and QN2 are commonly coupled via their bases, and the base current for first output driver 102 is denoted $$\frac{IOUT1}{\beta\_NPN},$$

where β_NPN represents the gain of the base current of output driver 102. QP1 and QP2 are commonly coupled via their bases, and the base current for second output driver 104 is denoted $$\frac{IOUT2}{\beta\_PNP},$$

where β_PNP represents the gain of the base current of output driver 104. "A_NPN" represents the total emitter area of output driver 102 (i.e. the emitter area of QN1 + the emitter area of QN2), and "A_PNP" represents the total emitter area of output driver 104 (i.e. the emitter area of QP1 + the emitter area of QP2).

Amplifier 100 also includes first and second current-replication transistors QN3 and QP3, respectively. First and second current mirrors 106 and 108, respectively, also form part of amplifier 100. In an example, each of the first and second current mirrors 106 and 108 is a fixed-gain current mirror. The input/output ratio of the currents of each of first and second current mirrors 106 and 108 is given by 1: (1/θ), where 0 < θ ≤ 1. Thus, 1/θ represents the gain factor of each current mirror 106 and 108.

QN3, which may be an NPN transistor, has an emitter that is coupled to the collector of QN1, where a fraction of the collector current of output driver 102 flows. That is, with the collector current of output driver 102 denoted as IOUT1, the current flowing at the emitter of QN3 is θ ∗ IOUT1. The remaining fraction of the collector current of output driver 102, denoted (1 - θ) ∗ IOUT1, flows at the collector of QN2. The base of QN3 is coupled to an input current terminal (IN) of first current mirror 106. An output current terminal (OUT) of first current mirror 106 is coupled to the control terminal of first output driver 102 (i.e. to the bases of transistors QN1 and QN2). First current mirror 106 also has a voltage terminal 110 coupled to the first voltage supply VCC, which is also coupled to the collectors of transistors QN2 and QN3. VCC may be a positive voltage supply.

QP3, which may be an PNP transistor, has an emitter that is coupled to the collector of QP1, where a fraction of the collector current of output driver 104 flows. That is, with the collector current of output driver 104 denoted as IOUT2, the current flowing at the emitter of QP3 is θ ∗ IOUT2. The remaining fraction of the collector current of output driver 104, denoted (1 - θ) ∗ IOUT2, flows at the collector of QP2. The base of QP3 is coupled to an input current terminal (IN) of second current mirror 108. An output current terminal (OUT) of second current mirror 108 is coupled to the control terminal of second output driver 104 (i.e. to the bases of transistors QP1 and QP2). Second current mirror 108 also has a voltage terminal 112 coupled to the second voltage supply VEE, which is also coupled to the collectors of transistors QP2 and QP3. VEE may be a negative voltage supply or ground.

In an example, each of output driver 102 and 104 may comprise a single output transistor. In that example, the emitter current at QN3 and QP3 is IOUT1 and IOUT2, respectively.

The emitters of the output transistors QN1, QN2, QP1 and QP2 are commonly coupled to form an output 114 of amplifier 100. Voltage and current signals VOUT and IOUT, respectively, are generated at output 114.

In an example, QN3 and QP3 are each configured to closely track or monitor the base current demands of first and second output drivers 102 and 104, respectively, over variations in their respective current gains (β). Doing so enables amplifier 100 to compensate for variations in output current, temperature, process, and mechanical strain, and to reduce the magnitudes of residual error currents. In response to β-independent current θ ∗ IOUT1 at the emitter of QN3, β-dependent current ~

$$\frac{\theta * IOUT1}{\beta\_NPN}$$

flows at the base of QN3. Current mirror 106 scales ~

$$\frac{\theta * IOUT1}{\beta\_NPN}$$

toaccurately generate the base current for output driver 102, i.e. to generate $$\sim \frac{IOUT1}{\beta\_NPN}.$$

Similarly, in response to β-independent current θ ∗ IOUT2 at the emitter QP3, β-dependent current ~

$$\frac{\theta * IOUT2}{\beta\_PNP}$$

flows at the base of QP3. Current mirror 108 scales ~ to accurately generate the base current for output driver 104, i.e. to generate ~

$$\frac{IOUT2}{\beta\_PNP}.$$

The β dependence of the outputs of current mirrors 106 and 108, due to use of current-replication transistors QN3 and QP3 respectively, allows current mirrors 106 and 108 to track (or monitor) the β-dependent base currents of output drivers 102 and 104 respectively, over variations of β. This reduces the magnitudes of residual error currents, denoted by ø in FIG. 1.

Generalizing, where ~ø associated with IOUT1 is denoted IERROR$_1$, and ~ø associated with IOUT2 is denoted IERROR$_2$, the currents generated by current mirrors 106 and 108 are designated as IBIAS_VAR$_1$ and IBIAS_VAR$_2$, respectively, and the base currents of output drivers 102 and 104 are denoted IBASE$_1$ and IBASE$_2$, respectively, yields the following:

$$IERROR_{1,2} = IBIAS\_VAR_{1,2} - IBASE_{1,2} =$$
$$\frac{1}{\theta} * \sim \frac{\theta * IOUT_{1,2}}{\beta_{NPN,PNP}} - \frac{IOUT_{1,2}}{\beta_{NPN,PNP}} =$$

$$IOUT_{1,2} \left( \sim \frac{1}{\beta_{NPN,PNP}} - \frac{1}{\beta_{NPN,PNP}} \right) = \sim 0.$$

Thus, the residual currents are approximately eliminated.

Figure 2:
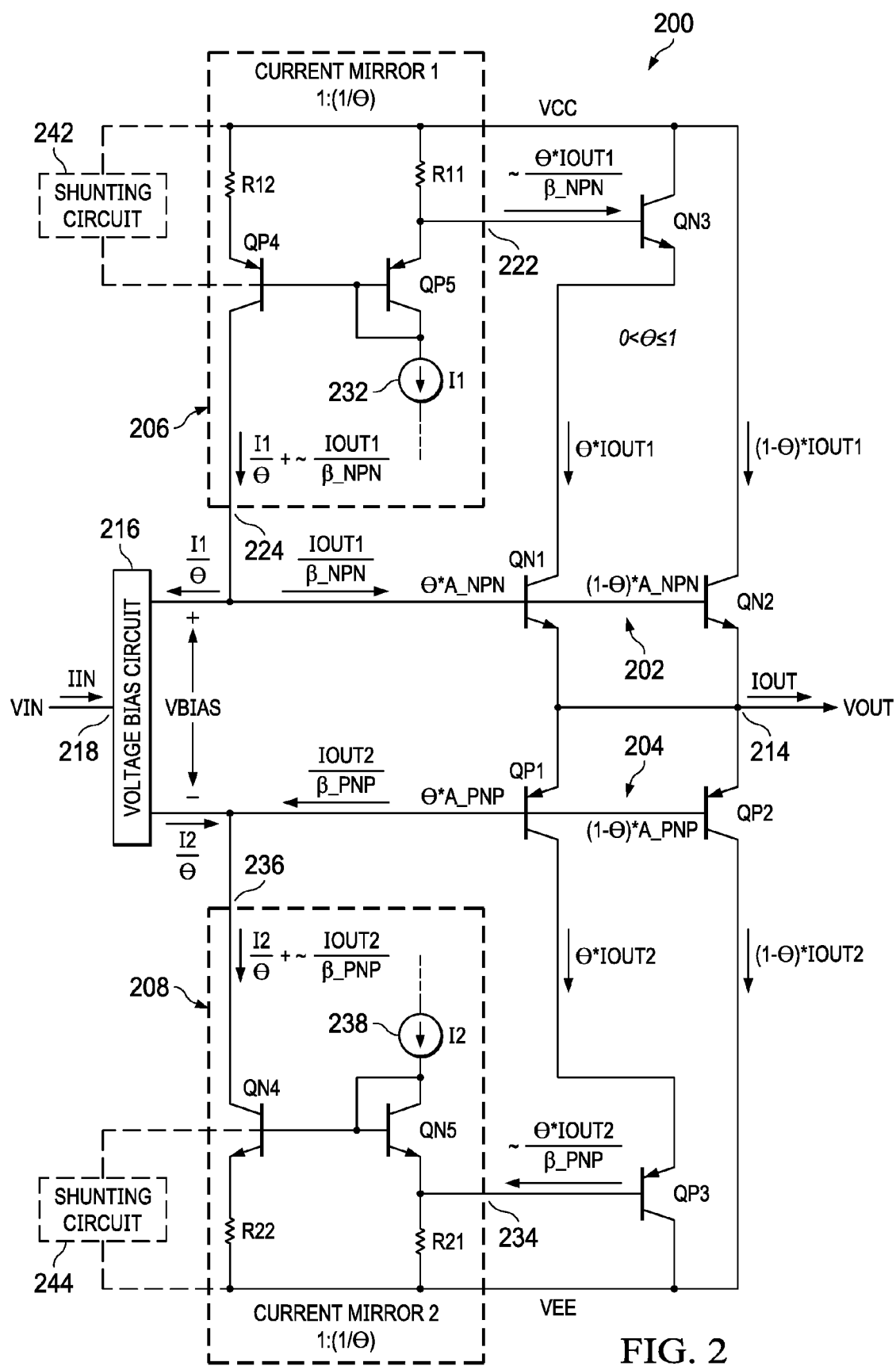
FIG. 2 is a circuit diagram of a second example of an amplifier with BJT output transistors.

FIG. 2 is a circuit diagram of a second example of a BJT amplifier 200 ("amplifier 200"), which is similar in several respects to amplifier 100. Amplifier 200 includes two output drivers: first output driver 202 and second output driver 204. First output driver 202 includes first and second output driver transistors QN1 and QN2, and second output driver 204 includes third and fourth output transistors QP1 and QP2. QN1 and QN2 are commonly coupled via their bases, and the base current for first output driver 202 is denoted $$\frac{IOUT1}{\beta\_NPN},$$

where β_NPN represents the gain of output driver 202. QP1 and QP2 are commonly coupled via their bases, and the base current for second output driver 204 is denoted $$\frac{IOUT2}{\beta\_PNP},$$

where β_PNP represents the gain of output driver 204. Amplifier 200 also includes first and second current-replication transistors QN3 and QP3, respectively. QN1, QN2, QN3, QP1, QP2 and QP3 in amplifier 200 are coupled as described above with reference to amplifier 100 of FIG. 1.

Amplifier 200 further includes first and second current mirrors 206 and 208, each of which is a low-input-headroom current mirror, which does not substantially interfere with (i.e. limit) the swing of VOUT at output 214. First current mirror 206 supplies the variable base current for output driver 202, i.e.

$$\sim \frac{\theta * IOUT2}{\beta\_PNP}$$

and second current mirror 208 supplies the variable base current for output driver 204, i.e.

$$\sim \frac{IOUT2}{\beta\_PNP}.$$

In this example, current mirrors 206 and 208 also supply DC bias currents for a voltage bias circuit 216 that is coupled to the control terminals of QN1, QN2, QP1 and QP2. First current mirror 206 generates DC bias current $$\frac{I1}{\theta},$$

and second current mirror 208 generates DC bias current $$\frac{I2}{\theta}.$$

These DC bias currents are generated due to the required bias currents I1 and I2 for voltage bias circuit 216. Each of the DC bias currents may be a fixed current.

Voltage bias circuit 216 has an input terminal 218 at which an input voltage VIN and an input current IIN is received. Voltage bias circuit 216 generates a voltage VBIAS across its output terminals, which are coupled to the control terminals of QN1/QN2 and QP1/QP2, respectively.

In an example, first current mirror 206 is of the current-sourcing type. First current mirror 206 includes two PNP transistors, QP4 and QP5, which are commonly coupled at their control terminals. The collector of QP5 is also coupled to the common base node of QP4 and QP5. Resistor R12 is disposed between the emitter of QP4 and VCC, and resistor R11 is disposed between the emitter of QP5 and VCC. An input current terminal 222 of current mirror 206 is formed at the node including the emitter of QP5 and is coupled to the control terminal of current-replication transistor QN3, and an output current terminal 224 of current mirror 206 is formed at the collector of QP4 and is coupled to the node extending between the (+) terminal of voltage bias circuit 216 and the control terminal of QN1. A current source 232 is coupled to the collector of QP5. Current source 232 generates the bias current I1.

In an example, second current mirror 208 is of the current-sinking type. Second current mirror 208 includes two NPN transistors, QN4 and QN5, which are commonly coupled at their control terminals. The collector of QN5 is also coupled to the common base node of QN4 and QN5. Resistor R22 is disposed between the emitter of QN4 and VEE, and resistor R21 is disposed between the emitter of QN5 and VEE. An input current terminal 234 of current mirror 208 is formed at the node including the emitter of QN5 and is coupled to the control terminal of current-replication transistor QP3, and an output current terminal 236 of current mirror 208 is formed at the collector of QN4 and is coupled to the node extending between the (-) terminal of voltage bias circuit 216 and the control terminal of QP1. A current source 238 is coupled to the collector of QN5. Current source 238 generates the bias current I2.

In an example, R11 and R21 are in the range of 100 - 10 kΩ, and R12 and R22 are sized to set the gains of current mirrors 206 and 208: R12 = θ*R11 and R22 = θ*R21, which results in values of for R12 and R22.

With the configuration of amplifier 200, current mirrors 206 and 208 generate base currents, $$\sim \frac{IOUT1}{\beta\_NPN}$$

and $$\sim \frac{IOUT2}{\beta\_PNP},$$

for output drivers 202 and 204, respectively. Current mirrors 206 and 208 also generate DC bias currents $$\frac{I1}{\theta}$$

and $$\frac{I2}{\theta}.$$

The gain of each current mirror 206 and 208 is set to rescale the generated base current according to the value of θ.

In an example, amplifier 200 may include first and second shunting circuits 242 and 244, respectively, which are shown in phantom in FIG. 2. Shunting circuit 242 may be coupled between the control terminal of QP4 and VCC, while shunting circuit 244 may be coupled between the control terminal of QN4 and VEE. Shunting circuits 242 and 244 may function to hold off current mirrors 206 and 208 when amplifier 200 is in power-down mode. In an example, each of shunting circuit 242 and 244 may be implemented by an appropriately sized resistor.

Figure 3:
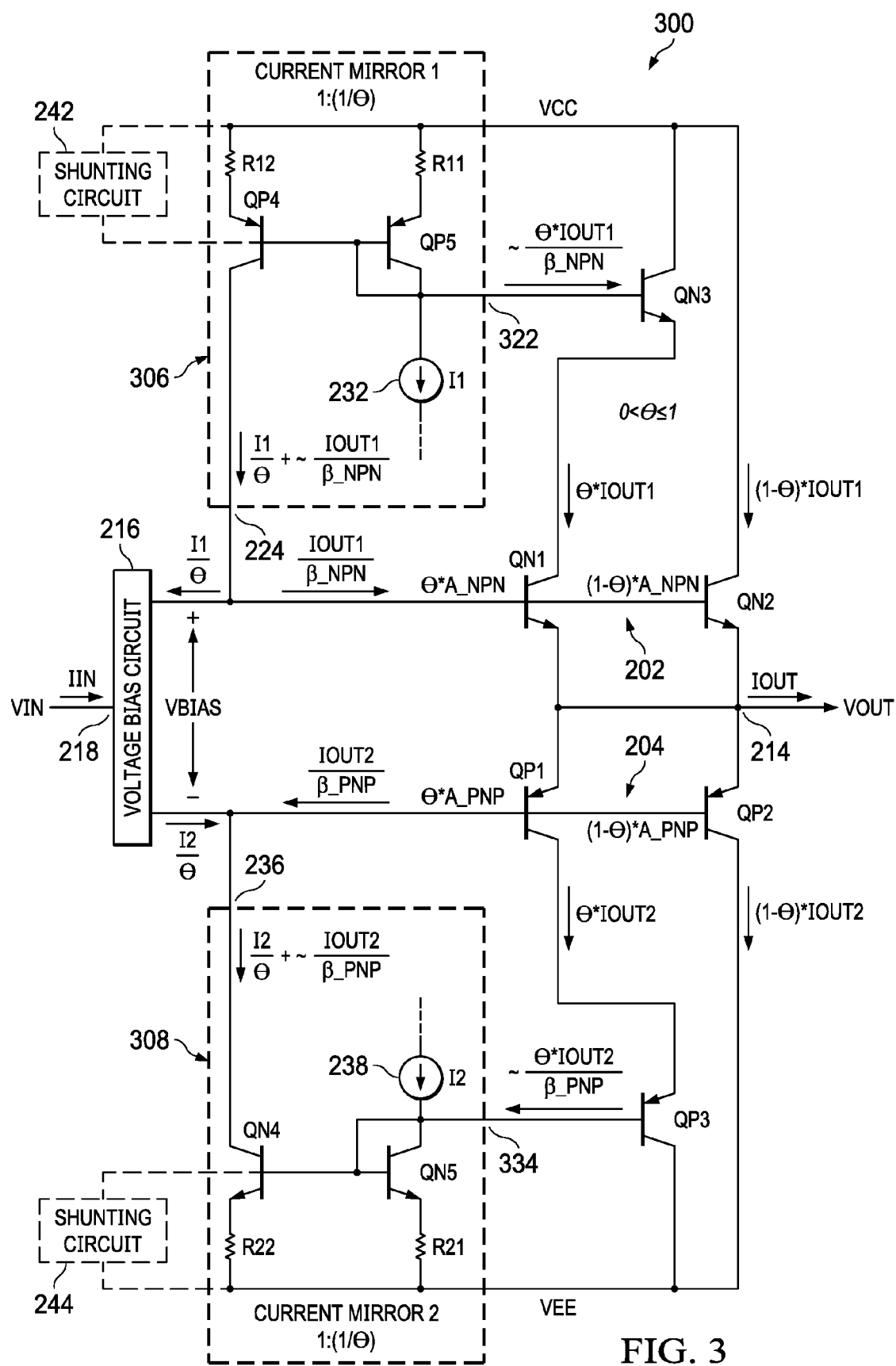
FIG. 3 is a circuit diagram of a third example of an amplifier with BJT output transistors.

FIG. 3 is a circuit diagram of a third example of a BJT amplifier 300 ("amplifier 300"), which is similar in several respects to amplifier 200. Thus, corresponding like elements in amplifier 300 are identified by the same reference numerals as in amplifier 200. However, instead of using low-input-headroom current mirrors 206 and 208, as in amplifier 200, amplifier 300 uses optional-bias-current current mirrors 306 and 308, respectively. Current mirror 306 is of the current-sourcing type, and is constructed similarly to current mirror 206. One difference is the location of the input current terminal. In current mirror 306, input current terminal 322 is formed at the collector of QP5. Another difference is that the presence of bias current I1 is optional. If bias current I1 is not present, the DC bias current $$\frac{I1}{\theta}$$

will not be generated. Current mirror 308 is of the current-sinking type, and is constructed similarly to current mirror 208. One difference is that, in current mirror 308, input terminal 334 is formed at the collector of QN5. Another difference is that the presence of bias current I2 is optional. If bias current I2 is not present, the DC bias current $$\frac{I2}{\theta}$$

will not be generated.

In the arrangement of FIG. 3, the bias currents I1 and I2, as well as the DC bias currents $$\frac{I1}{\theta}$$

and $$\frac{I2}{\theta}$$

are optional, but compared to the arrangement of FIG. 2, the output swing range of VOUT is more limited due to the increased input headroom of current mirrors 306 and 308.

Figure 4:
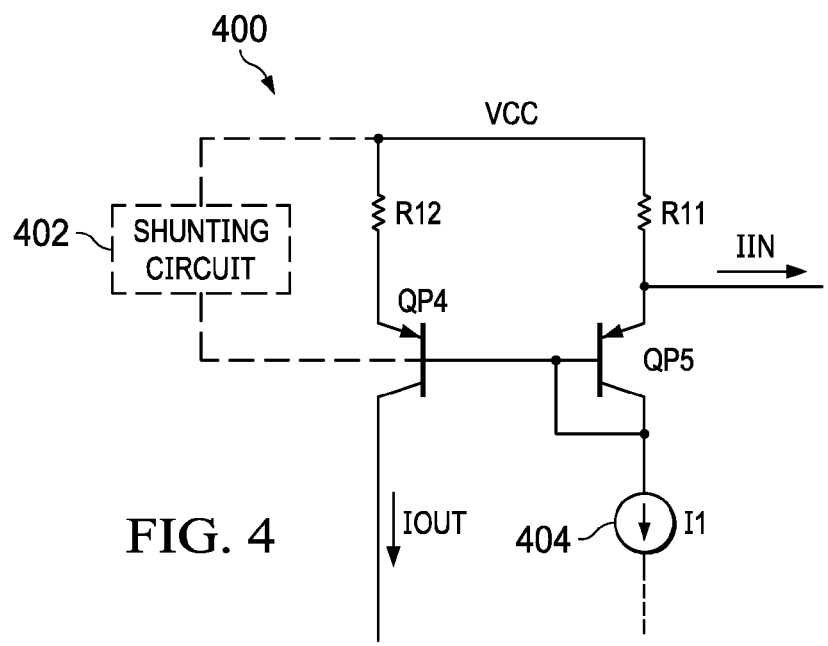
FIG. 4 is a circuit diagram of a first example of a low-input-headroom current mirror.

FIG. 4 is a circuit diagram of an example current-sourcing low-input-headroom current mirror 400. Current mirror 400 may implement, for example, current mirror 206 in amplifier 200. In the example of FIG. 4, the input and output currents of current mirror 400 at respective input and output current terminals are denoted generally as IIN and IOUT, respectively. Current mirror 400 may include a shunting circuit 402 coupled between the common control or base terminal of QP4/QP5 and VCC. Resistor R12 is coupled between the emitter of QP4 and VCC, and resistor R11 is coupled between the emitter of QP5 and VCC. The common control terminal node of QP4 and QP5 is coupled to the collector of QP5. A current source 404, coupled to the collector of QP5, generates the bias current I1.

Figure 5:
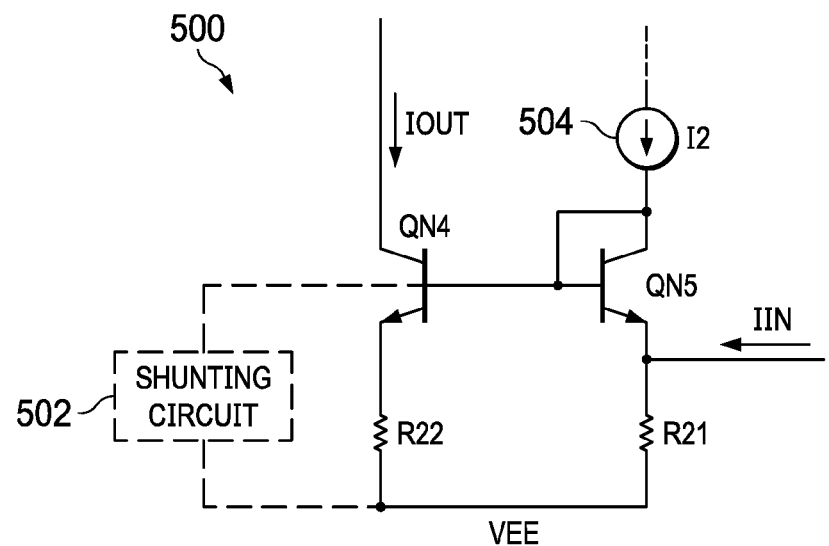
FIG. 5 is a circuit diagram of a second example of a low-input-headroom current mirror.

FIG. 5 is a circuit diagram of an example current-sinking low-input-headroom current mirror 500. Current mirror 500 may implement, for example, current mirror 208 in amplifier 200. The example of FIG. 5 more generally denotes the input and output currents of current mirror 500 at respective input and output current terminals as IIN and IOUT, respectively. Current mirror 500 may include a shunting circuit 502 coupled between the common control or base terminal of QN4/QN5 and VEE. Resistor R22 is coupled between the emitter of QN4 and VEE, and resistor R21 is coupled between the emitter of QN5 and VEE. A current source 504, coupled to the collector of QN5, generates the bias current I2.

Figure 6:
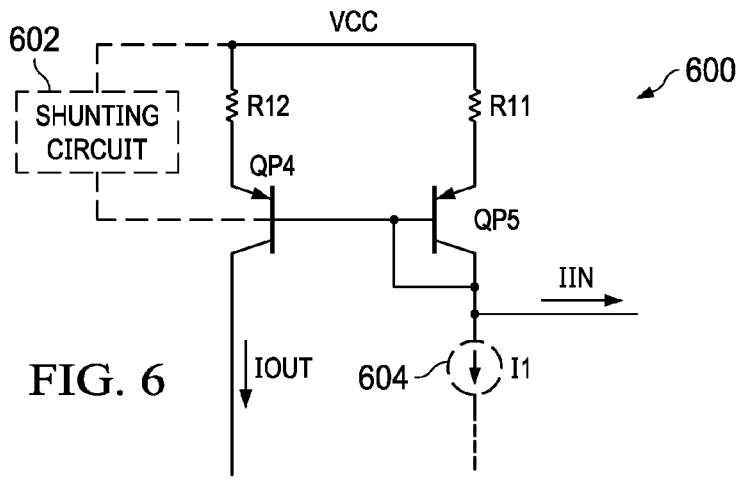
FIG. 6 is a circuit diagram of a first example of a current mirror that does not require a separate bias current.
Figure 7:
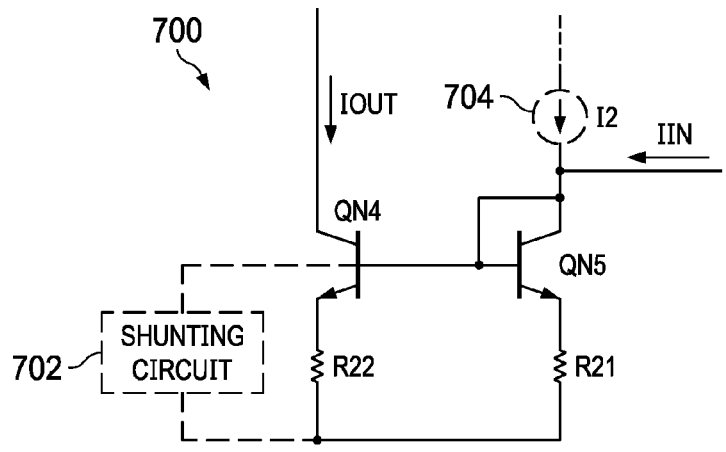
FIG. 7 is a circuit diagram of a second example of a current mirror that does not require a separate bias current.

FIG. 6 is a circuit diagram of an example current-sourcing current mirror 600 for generating a bias current in a BJT amplifier, and FIG. 7 is a circuit diagram of an example current-sinking current mirror 700 for generating a bias current in a BJT amplifier. Current mirrors 600 and 700 may implement, for example, current mirrors 306 and 308, respectively, in amplifier 300. The examples of FIGS. 6 and 7 more generally denote the input and output currents of respective current mirrors 600 and 700 at respective input and output current terminals as IIN and IOUT, respectively. A shunting circuit 602 of current mirror 600 is coupled between the common control or base terminal of QP4/QP5 and VCC, and a shunting circuit 702 of current mirror 700 is coupled between the common control or base terminal of QN4/QN5 and VEE. In current mirror 600, resistor R12 is coupled between the emitter of QP4 and VCC, and resistor R11 is coupled between the emitter of QP5 and VCC. In current mirror 700, resistor R22 is coupled between the emitter of QN4 and VEE, and resistor R21 is coupled between the emitter of QN5 and VEE. Current sources 604 and 704, shown in phantom in FIGS. 6 and 7 may be employed to generate the bias currents I1 and I2 in current mirrors 600 and 700, respectively. In some examples, current sources 604 and 704 may be omitted.

Figure 8:
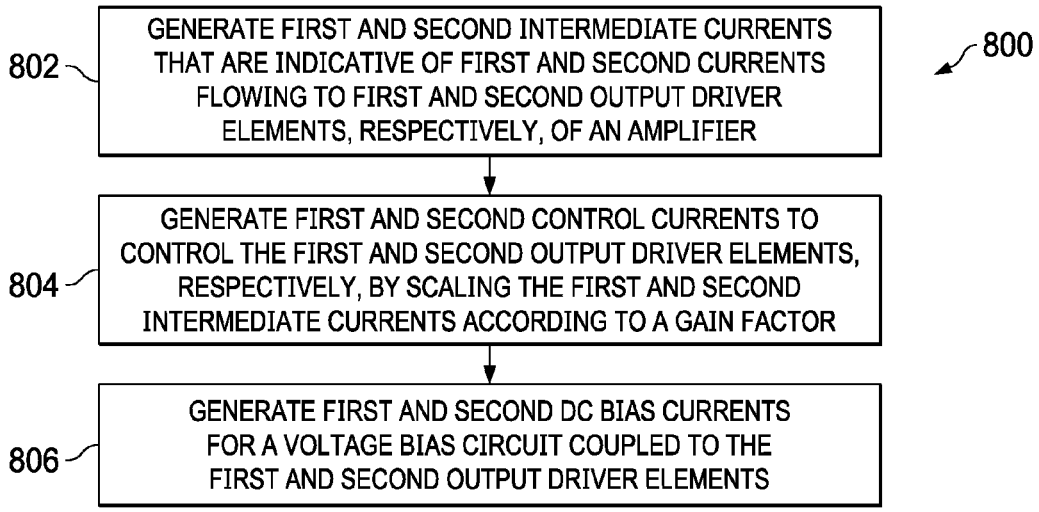
FIG. 8 is a flow diagram of an example method of operating a BJT amplifier.

FIG. 8 is a flow diagram of an example method 800 of operating a BJT amplifier, e.g., amplifier 100, 200 and/or 300. In operation 802, first and second β-dependent intermediate currents (i.e.

$$\sim \frac{\theta * IOUT1}{\beta\_NPN}$$

and $$\sim \frac{\theta * IOUT2}{\beta\_PNP},$$

that are indicative of first and second currents flowing to first and second output driver elements, respectively, are generated. In operation 804, first and second β-dependent control currents (i.e.

$$\sim \frac{IOUT1}{\beta\_NPN}$$

and $$\sim \frac{IOUT2}{\beta\_PNP},$$

) are generated using first and second current mirrors (i.e. current mirrors 106 and 108) by scaling the first and second intermediate currents according to the gain factor θ of the current mirrors.

In some examples, method 800 may further include operation 806, in which first and second DC bias currents $$\frac{I1}{\theta}$$

and $$\frac{I2}{\theta}$$

are generated using the first and second current mirrors, respectively, for a voltage bias circuit coupled to the first and second output driver elements. In an example, each bias current is proportional to the bias current of its corresponding current mirror (i.e. I1 or I2) and is scaled by the current mirror gain factor. In an example, the first DC bias current is proportional to the first current mirror bias current I1 by that mirror gain factor, and the second DC bias current is proportional to the second current mirror bias current I2 by that mirror gain factor.

FIG. 8 depicts one possible order of operations. Not all operations need necessarily be performed, nor need be performed in the order described. Some operations may be combined into a single operation. Additional operations and/or alternative operations may be performed.

Various examples of BJT amplifiers and methods avoid or minimize the occurrence of residual error currents, thus eliminating or minimizing a cause of output signal distortion and undesirable variation in the quiescent biasing of output driver transistors. In an example, current-replication transistors in a BJT amplifier closely track or monitor the current demands of output drivers in such amplifier over variations in current gain (β) of the control terminal currents of the output drivers. The current-replication transistors accurately replicate the base currents of the output driver transistors over β variation by sensing portions of the collector currents of the output driver transistors. Fixed-gain current mirrors, rescale and supply replica currents to the control terminals of the output driver transistors. Various types of current mirrors for use in the BJT amplifiers are provided.

In the examples described herein, the term "control terminal(s)" refers to the base of the corresponding transistor(s).

The term "couple" is used throughout the specification. The term and derivatives thereof may cover connections, communications, or signal paths that enable a functional relationship consistent with this description. For example, if device A provides a signal to control device B to perform an action, in a first example device A is coupled to device B, or in a second example device A is coupled to device B through intervening component C if intervening component C does not substantially alter the functional relationship between device A and device B such that device B is controlled by device A via the control signal provided by device A.

A device that is "configured to" perform a task or function may be configured (i.e. programmed and/or hardwired) at a time of manufacturing by a manufacturer to perform the function and/or may be configurable (or re-configurable) by a user after manufacturing to perform the function and/ or other additional or alternative functions. The configuring may be through firmware and/or software programming of the device, through a construction and/or layout of hardware components and interconnections of the device, or a combination thereof.

As used herein, the term "terminal" means "node", "interconnection", "pin" and/or "lead". Unless specifically stated to the contrary, these terms generally mean an interconnection between or a terminus of a device element, a circuit element, an integrated circuit, a device or other electronic or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (i.e. a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While the use of bipolar junction transistors (BJTs) is described herein, other types of transistors (or equivalent devices) may be used instead. For example, instead of using n- and p-type BJTs, n-type metal-oxide-silicon field-effect transistors (MOSFETs) may be used instead or in addition to BJTs in the various circuits described. Specifically relating to the output driver transistors of the amplifier, although use of such alternative devices as drivers may not exhibit the same DC-coupled current draw at their control terminals (i.e. gate terminals for MOSFETs) as with the base currents of BJT devices, the alternative devices may exhibit large input capacitance resulting in significant AC-current input errors, and many of the methods described may be applied for the correction or mitigation of those errors.

Circuits described herein are reconfigurable to include the replaced components to provide functionality at least partially similar to functionality available prior to the component replacement.

Uses of the phrase "ground" in the foregoing description includes a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means +/-10 percent of the stated value.

Modifications of the described examples are possible, as are other examples, within the scope of the claims. Moreover, features described herein may be applied in other environments and applications consistent with the teachings provided.

What is claimed is:

1. An amplifier comprising:
    a first output driver having a control terminal;
    a first current-replication transistor having a control terminal;
    a first current mirror having an input current terminal coupled to the control terminal of the first current-replication transistor and having an output current terminal coupled to the control terminal of the first output driver;
    a second output driver having a control terminal;
    a second current-replication transistor having a control terminal; and
    a second current mirror having an input current terminal coupled to the control terminal of the second current-replication transistor and having an output current terminal coupled to the control terminal of the second output driver;
    wherein:
        the first output driver includes a first output transistor and a second output transistor, the first output transistor having a first current terminal; and
        the second output driver includes a third output transistor and a fourth output transistor, the third output transistor having a first current terminal.

2. The amplifier of claim 1, further comprising:
    a first current-replication transistor having first and second current terminals, the first current terminal coupled to a voltage input of the first current mirror and the second current terminal coupled to the first current terminal of the first output transistor; and
    a second current-replication transistor having first and second current terminals, the first current terminal coupled to a voltage input of the second current mirror and the second current terminal coupled to the first current terminal of the second output transistor.

3. The amplifier of claim 1, wherein:
    the second output transistor is coupled to the first output transistor to form a first control current path; and
    the fourth output transistor is coupled to the third output transistor to form a second control current path.

4. The amplifier of claim 2, wherein each of the first current-replication transistor, the first output transistor, and the second output driver transistor is an NPN transistor, and each of the second current-replication transistor, the third output transistor, and the fourth output driver transistor is an PNP transistor.

5. The amplifier of claim 2, wherein:
    the first current-replication transistor is configured to generate a scaled version of a first control current supplied to the control terminal of the first output driver; and
    the second current-replication transistor is configured to generate a scaled version of a second control current supplied to the control terminal of the second output driver.

6. The amplifier of claim 5, wherein:
    the first current mirror generates a current dependent on a gain of the first output driver based on the scaled version of the first control current; and
    the second current mirror generates a current dependent on a gain of the second output driver based on the scaled version of the second control current.

7. The amplifier of claim 1, wherein the first current mirror includes:
    first and second PNP transistors having commonly coupled control terminals, the second PNP transistor having a collector terminal coupled to the commonly coupled control terminals;
    a current source coupled to the collector terminal of the second PNP transistor;
    an input terminal at an emitter terminal of the second PNP transistor; and
    an output terminal at a collector terminal of the first PNP transistor.

8. The amplifier of claim 1, wherein the first current mirror includes:
    first and second NPN transistors having commonly coupled control terminals, the second NPN transistor having a collector terminal coupled to the commonly coupled control terminals;
    a current source coupled to the collector terminal of the second NPN transistor;
    an input terminal at an emitter terminal of the second NPN transistor; and
    an output terminal at a collector terminal of the first NPN transistor.

9. The amplifier of claim 1, wherein the second current mirror includes:
    first and second PNP transistors having commonly coupled control terminals, the second PNP transistor having a collector terminal coupled to the commonly coupled control terminals;
    a current source coupled to the collector terminal of the second PNP transistor;
    an input terminal at the collector terminal of the second PNP transistor; and
    an output terminal at a collector terminal of the first PNP transistor.

10. The amplifier of claim 1, wherein the second current mirror includes:
    first and second NPN transistors having commonly coupled control terminals, the second NPN transistor having a collector terminal coupled to the commonly coupled control terminals;
    a current source coupled to the collector terminal of the second NPN transistor;
    an input terminal at the collector terminal of the second NPN transistor; and
    an output terminal at a collector terminal of the first NPN transistor.

11. The amplifier of claim 10, wherein the tracking stage includes first and second current-replication transistors, the first current replication transistor having a current terminal coupled to the first output driver, and the second current-replication transistor having a current terminal coupled to the second output driver.

12. The amplifier of claim 11, wherein the current generating stage includes:
    a first current mirror having an input terminal coupled to the control terminal of the first current-replication transistor, and an output terminal coupled to the first control terminal node; and a second current mirror having an input terminal coupled to the control terminal of the second current-replication transistor, and an output terminal coupled to the second control terminal node.

13. The amplifier of claim 12, wherein the first current mirror is a current-sourcing current mirror, and the second current mirror is a current-sinking current mirror.

14. An amplifier comprising:

an output driver stage including first and second control terminals and an output terminal at which an output signal of the amplifier is generated;

a tracking stage coupled to the output driver stage and configured to track current demands of the output driver stage over variations of gains of currents supplied to the control terminals of the output driver stage; and a current generating stage coupled to the tracking stage and configured to generate currents for the control terminals of the output stage;

wherein the output driver stage includes first and second output drivers;

wherein:

the first output driver includes a first output transistor and a second output transistor, the first output transistor having a first current terminal; and the second output driver includes a third output transistor and a fourth output transistor, the third output transistor having a first current terminal.

\* \* \* \* \*